(12) United States Patent
Krutsick

(10) Patent No.: US 7,715,162 B2
(45) Date of Patent: May 11, 2010

(54) OPTICALLY TRIGGERED ELECTRO-STATIC DISCHARGE PROTECTION CIRCUIT

(75) Inventor: Thomas Joseph Krutsick, Fleetwood, PA (US)

(73) Assignee: Zarlink Semiconductor (US) Inc., Austin, TX (US)

( * ) Notice: Subject to any disclaimer, the term of this patent is extended or adjusted under 35 U.S.C. 154(b) by 259 days.

(21) Appl. No.: 12/046,683

(22) Filed: Mar. 12, 2008

(65) Prior Publication Data

US 2009/0230476 A1 Sep. 17, 2009

(51) Int. Cl.
*H02H 3/20* (2006.01)
*H01L 29/68* (2006.01)

(52) U.S. Cl. .................. 361/91.4; 257/113; 257/114; 257/115; 257/118; 257/E27.127

(58) Field of Classification Search ............... 361/91.4, 361/117; 257/113–115, 118
See application file for complete search history.

(56) References Cited

U.S. PATENT DOCUMENTS

| 7,439,597 | B2* | 10/2008 | Shiu et al. | 257/431 |
| 7,637,671 | B2* | 12/2009 | Schempp | 385/89 |
| 2003/0107324 | A1* | 6/2003 | Cho et al. | 315/149 |
| 2004/0151219 | A1* | 8/2004 | Numano | 372/29.015 |

* cited by examiner

*Primary Examiner*—Evan Pert
(74) *Attorney, Agent, or Firm*—Williams, Morgan & Amerson

(57) ABSTRACT

The present invention provides a method and apparatus for providing electro-static discharge (ESD) protection between a first and a second circuit node. One embodiment of the ESD protection circuit includes one or more steering diodes that generate electromagnetic radiation and couple the first circuit node to ground in response to a voltage applied to the first circuit node. The ESD protection circuit also includes a latch circuit that couples the first circuit node to ground in response to the electromagnetic radiation generated by the steering diode(s).

17 Claims, 5 Drawing Sheets

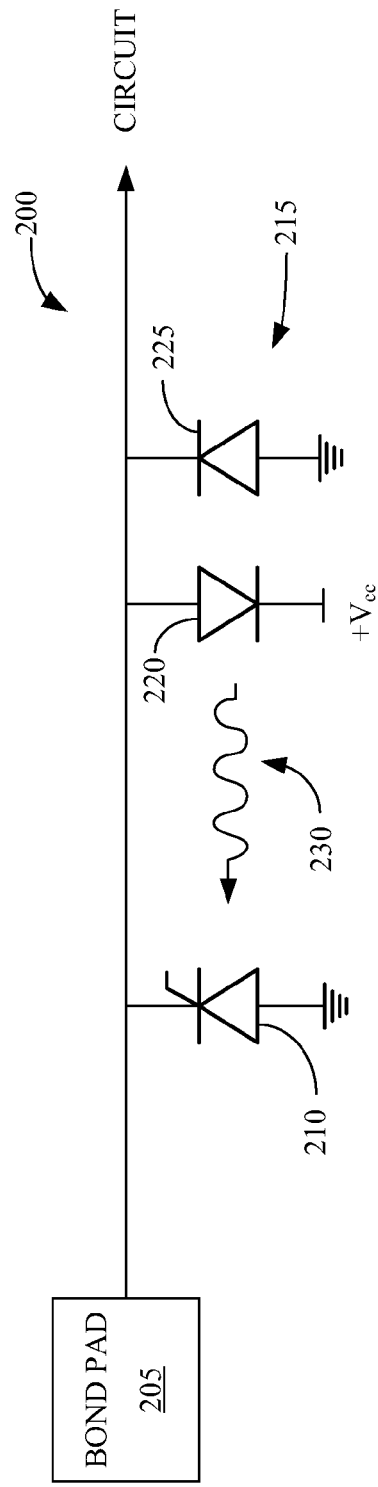
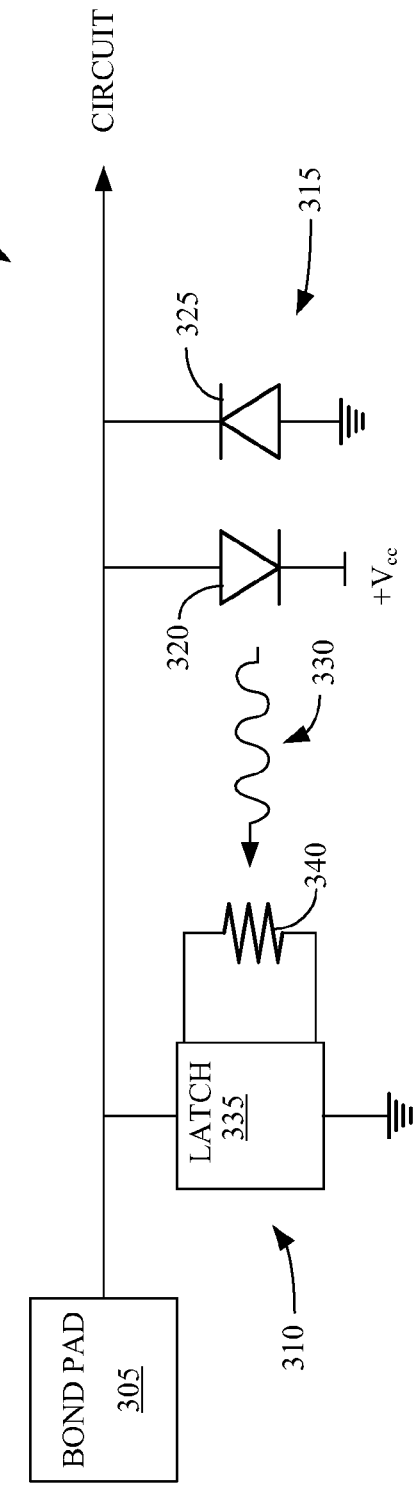

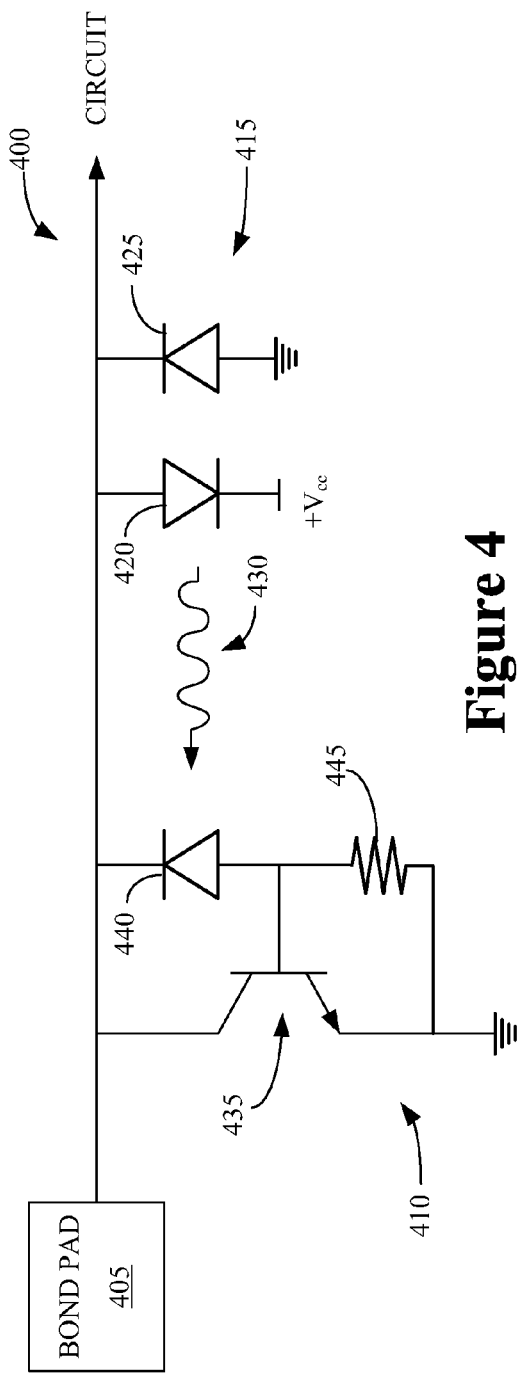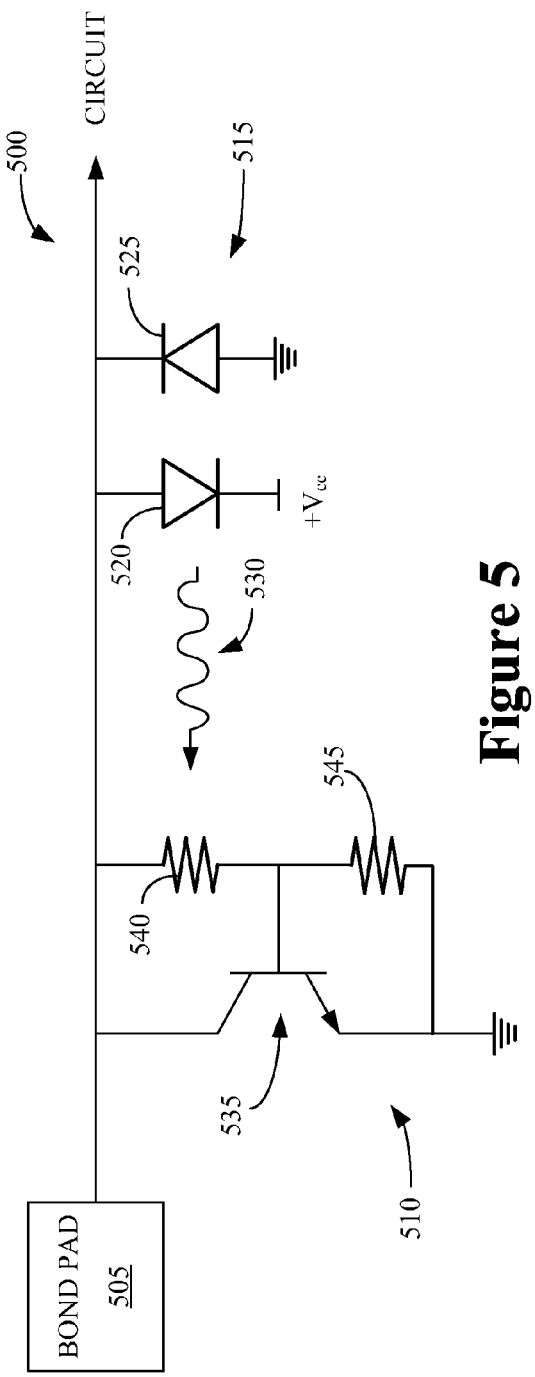

OPTICALLY TRIGGERED ELECTRO-STATIC DISCHARGE PROTECTION CIRCUIT

CROSS REFERENCE TO RELATED APPLICATIONS

This application is related to Ser. No. 12/046,642 entitled "A Protection Circuit for a Subscriber Line Interface Circuit," by Christopher J. Speyer filed on Mar. 12, 2008.

BACKGROUND OF THE INVENTION

1. Field of the Invention

This invention relates generally to electrostatic discharge protection, and, more particularly, to an optically triggered electrostatic discharge protection circuit.

2. Description of the Related Art

Circuits, particularly integrated circuits that are formed on semiconductor wafers, are vulnerable to damage or destruction caused by unexpectedly large surges of power through the circuit. For example, a packaged integrated circuit typically includes numerous bond pads that can be used to electrically couple the integrated circuit to the outside world. However, current from electrostatic discharges, e.g. from lightning strikes or static electricity buildup on a person, can enter the integrated circuit through the bond pads and potentially cause damage to the integrated circuit. Circuit packages therefore typically include electrostatic discharge (ESD) protection circuits that attempt to electrically isolate the bond pad from the integrated circuit in the event of an unexpectedly large power surge. The ESD protection circuit usually directs the current produced by the power surge to ground so that this current does not enter the protected circuit.

FIG. 1 conceptually illustrates a conventional ESD protection circuit 100. In the illustrated embodiment, a bond pad 105 is separated from a circuit by a primary ESD protection element 110, an isolation resistor 115, and a secondary ESD protection element 120. The secondary ESD protection element 120 typically turns on in response to an ESD event to protect the circuit until the primary ESD protection element 110 can turn fully on. The primary ESD protection element 110 shunts most (or all) of the current during the ESD event. However, the primary ESD protection element 110 may not immediately reach a fully on state in response to the start of the ESD event. The secondary ESD protection element 120 may therefore serve to limit the voltage/current until the primary ESD protection element 110 is fully on. Current is pulled from the bond pad through the isolation resistor 115 when the secondary ESD protection element 120 turns on. The current causes a potential drop across the isolation resistor 115 and the primary ESD protection element 110 turns on when this potential drop reaches the triggering voltage of the primary ESD protection element 110.

The conventional ESD protection circuit 100 suffers from a number of drawbacks. For example, problems may occur with setting the proper latching thresholds for a given technology. Furthermore, the additional resistance and/or capacitance associated with the conventional ESD protection circuit 100, and in particular the isolation resistor 115, may limit the range and/or performance of the protected circuit or node.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, an electro-static discharge (ESD) protection circuit is provided for deployment between a first and a second circuit node. The ESD protection circuit includes one or more steering diodes that generate electromagnetic radiation and couple the first circuit node to ground in response to a voltage applied to the first circuit node. The ESD protection circuit also includes a latch circuit that couples the first circuit node to ground in response to the electromagnetic radiation generated by the steering diode(s).

In another embodiment of the present invention, a method is provided for electro-static discharge (ESD) protection between a first and a second circuit node. The method includes generating electromagnetic radiation and coupling the first circuit node to ground in response to a voltage applied to the first circuit node. The method also includes coupling the first circuit node to ground in response to the electromagnetic radiation generated by the steering diode(s).

BRIEF DESCRIPTION OF THE DRAWINGS

The invention may be understood by reference to the following description taken in conjunction with the accompanying drawings, in which like reference numerals identify like elements, and in which:

FIG. 2 conceptually illustrates a first exemplary embodiment of an optically triggered ESD protection circuit, in accordance with the present invention;

FIG. 3 conceptually illustrates a second exemplary embodiment of an optically triggered ESD protection circuit, in accordance with the present invention;

FIG. 4 conceptually illustrates a third exemplary embodiment of an optically triggered ESD protection circuit, in accordance with the present invention;

FIG. 5 conceptually illustrates a fourth exemplary embodiment of an optically triggered ESD protection circuit, in accordance with the present invention;

Figure 1:
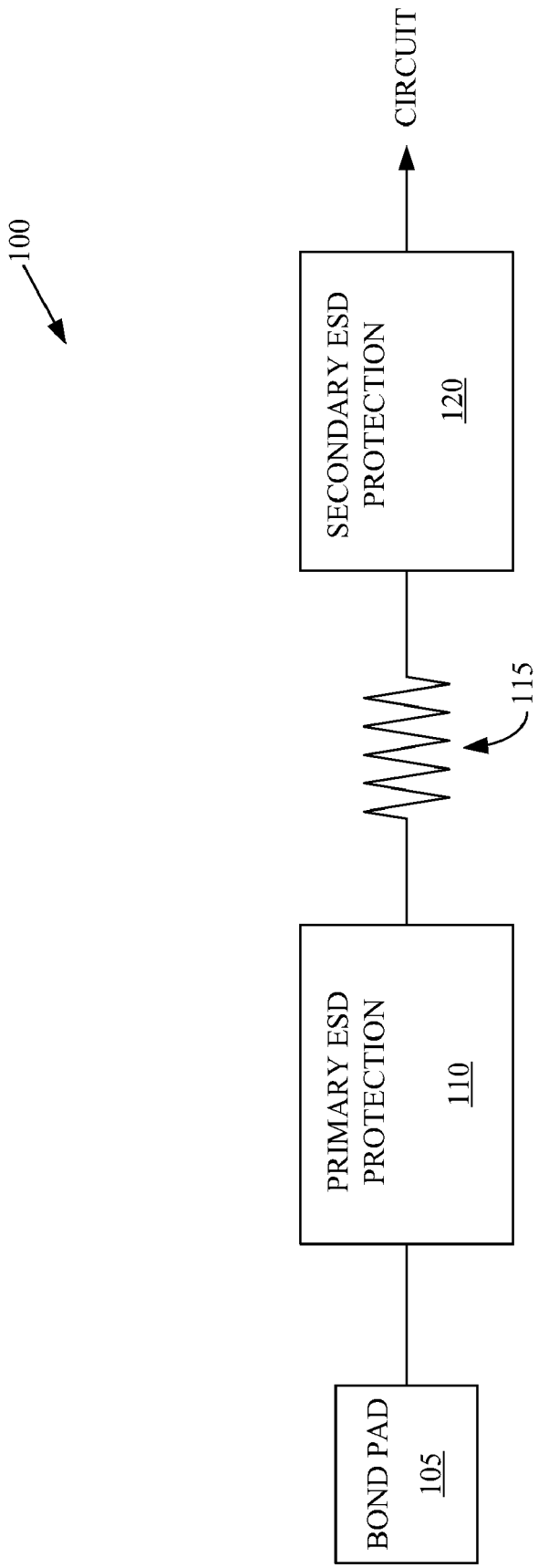
FIG. 1 conceptually illustrates a conventional ESD protection circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 2 conceptually illustrates a first exemplary embodiment of an optically triggered ESD protection circuit 200. In the illustrated embodiment, a bond pad 205 is separated from a circuit by a primary ESD protection element 210 and a secondary ESD protection element 215. The secondary ESD protection element 215 shown in FIG. 2 includes one or more steering diodes 220, 225 that generate electromagnetic radiation 230 when they are in the conductive or ON state. However, persons of ordinary skill in the art having benefit of the present disclosure should appreciate that the secondary ESD protection element 215 does not have to include diodes 220, 255 between the bonding pad 205 and the power/ground supplies, as long as the secondary ESD protection element 215 emits radiation when it is in a conductive state.

In the illustrated embodiment, the secondary ESD protection element 215 includes two steering diodes 220, 225 that are oriented opposite each other so that one of the steering diodes 225 turns on in response to a negative voltage and the other steering diode 220 turns on in response to a positive voltage that exceeds the common collector voltage (Vcc) in the circuit. The steering diodes 220, 225 may be triggered to enter the conductive state by forward biasing, reverse breakdown, avalanche breakdown, and the like. Persons of ordinary skill in the art having benefit of the present disclosure should appreciate that the secondary ESD protection element 215 may include more or fewer steering diodes 220, 225 or other elements that generate electromagnetic radiation when in the conductive state. Persons of ordinary skill in the art having benefit of the present disclosure should appreciate that the techniques described herein may also be applicable to other protection schemes such as protection schemes for power cross, short circuit protection, lightning surge, and the like.

The primary ESD protection element 210 shown in FIG. 2 is an optically coupled silicon controlled rectifier (SCR) or a thyristor 210. The thyristor 210 turns on and provides a conductive path between the bond pad 205 and ground in response to electromagnetic radiation, such as the electromagnetic radiation generated by the secondary ESD protection element 215. However, persons of ordinary skill in the art having benefit of the present disclosure should appreciate that the primary ESD protection element 210 may be formed using elements other than the optically coupled silicon-controlled rectifier and/or the thyristor 210. In alternative embodiments, the primary ESD protection element 210 may be a photo-transistor, a MOS device, a crowbar that shorts out the rails/supplies of the circuit, or any other optically-triggered device that shunts current from the bond pad 205 to ground or a power supply so that current does not go through the protected circuit.

The frequency and/or wavelength of the electromagnetic radiation generated by the secondary ESD protection element 215 may be tuned to a sensitivity range of the optically-triggered primary ESD protection element 210. In one embodiment, if the optically-triggered primary ESD protection element 210 has a sensitivity range in the optical region of the spectrum, then the secondary ESD protection element 215 may be configured to provide electromagnetic radiation at optical wavelengths and/or frequencies. For example, steering diodes 220, 225 that are triggered by reverse breakdown may be used to provide the optical emission. Alternatively, the secondary ESD protection element 215 may be configured to provide electromagnetic radiation at infrared wavelengths and/or frequencies if the primary ESD protection element 210 is sensitive to infrared radiation. For example, steering diodes 220, 225 that are triggered by forward biasing may be used to provide the infrared emission.

In operation, the secondary ESD protection element 215 turns on in response to an ESD event to protect the circuit until the primary ESD protection element 210 can turn on. Current is pulled from the bond pad 205 when the secondary ESD protection element 215 turns on. The current travels through the secondary ESD protection element 215 and energy dissipated in the secondary ESD protection elements 215 generates electromagnetic radiation. The primary ESD protection element 210 turns on when the energy (or intensity or other parameter) received in the electromagnetic radiation reaches a threshold level. The optical coupling between the primary and secondary ESD protection elements 210, 215 results in relatively fast regenerative latching compared to the conventional ESD protection techniques that use the current traveling through an isolation resistor to trigger the primary ESD protection elements 210. However, in some embodiments, an isolation resistor may be included in the circuit 200 to limit the current that travels to the secondary ESD protection element 215. The optical coupling between the primary and secondary ESD protection elements 210, 215 also permits more accurate tuning of the turn on thresholds relative to conventional techniques.

FIG. 3 conceptually illustrates a second exemplary embodiment of an optically triggered ESD protection circuit 300. In the illustrated embodiment, a bond pad 305 is separated from a circuit by a primary ESD protection element 310 and a secondary ESD protection element 315. The secondary ESD protection element 315 includes one or more steering diodes 320, 325 that generate electromagnetic radiation 330 when they are in the conductive or ON state. In the illustrated embodiment, the secondary ESD protection element 315 includes two steering diodes 320, 325 that are oriented opposite each other so that one of the steering diodes 325 turns on in response to a negative voltage and the other steering diode 320 turns on in response to a positive voltage that exceeds the common collector voltage (Vcc) in the circuit. The steering diodes 320, 325 may be triggered by either forward biasing or reverse breakdown.

The second exemplary embodiment of the optically triggered ESD protection circuit 300 differs from the first exemplary embodiment in that the primary ESD protection element 310 includes a latch circuit 335 that receives a signal from an optically sensitive resistor 340. Persons of ordinary skill in the art should appreciate that there may also be other differences between the first and second exemplary embodiments. The resistance of the resistor 340 changes in response to the electromagnetic radiation received from the secondary ESD protection element 315. The changing resistance of the resistor 340 causes a current and/or a voltage drop across the resistor 340 to change. The latch circuit 335 detects this change and uses it as a trigger to latch and provide a conductive path between the bond pad 305 and ground. The latch circuit 335 may be any type of switching or latching circuit that can provide a conductive path in response to detecting a change in the voltage drop over the resistor 340. For example, the latched circuit 335 may be formed using bipolar transistor technology, CMOS transistor technology, NMOS transistor technology, PMOS transistor technology, or any combination thereof. The frequency and/or wavelength of the electromagnetic radiation generated by the secondary ESD protection element 315 may be tuned to a sensitivity range of the optically sensitive resistor 340 in the optically-triggered primary ESD protection element 310.

FIG. 4 conceptually illustrates a third exemplary embodiment of an optically triggered ESD protection circuit 400. In the illustrated embodiment, a bond pad 405 is separated from a circuit by a primary ESD protection element 410 and a secondary ESD protection element 415. The secondary ESD protection element 415 includes one or more steering diodes 420, 425 that generate electromagnetic radiation 430 when they are in the conductive or ON state. In the illustrated embodiment, the secondary ESD protection element 415 includes two steering diodes 420, 425 that are oriented opposite each other so that one of the steering diodes 425 turns on in response to a negative voltage and the other steering diode 420 turns on in response to a positive voltage that exceeds the common collector voltage (Vcc) in the circuit. The steering diodes 420, 425 may be triggered by either forward biasing or reverse breakdown.

The third exemplary embodiment of the optically triggered ESD protection circuit 400 differs from the first and second exemplary embodiments in that the primary ESD protection element 410 includes a transistor 435 that receives a signal from a photodiode 440. In the illustrated embodiment, the photo-diode 440 is reverse biased so substantially no current flows until the incoming light 430 increases the reverse current in the photo-diode 440. Persons of ordinary skill in the art will appreciate that there is always a small leakage current in the photodiode 440 but that this current is below a threshold current. The current in the photodiode 440 increases above the threshold when stimulated, e.g., when the photodiode 440 is irradiated by the incoming light 430. Alternatively, the photodiode 440 could operate as a generator or photovoltaic. A resistor 445 may also be coupled between the photodiode 440 and ground. Persons of ordinary skill in the art should appreciate that there may also be other differences between the first, second, and third exemplary embodiments. The photodiode 440 turns on and enters a conductive state in response to the electromagnetic radiation received from the secondary ESD protection element 415. Once the photodiode 440 turns on, the voltage at the bond pad 445 may be provided to a base of the transistor 435 to turn the transistor 435 on and provide a conductive path between the bond pad 405 and ground. The frequency and/or wavelength of the electromagnetic radiation generated by the secondary ESD protection element 415 may be tuned to a sensitivity range of the photodiode 440 in the optically-triggered primary ESD protection element 410.

FIG. 5 conceptually illustrates a fourth exemplary embodiment of an optically triggered ESD protection circuit 500. In the illustrated embodiment, a bond pad 505 is separated from a circuit by a primary ESD protection element 510 and a secondary ESD protection element 515. The secondary ESD protection element 515 includes one or more steering diodes 520, 525 that generate electromagnetic radiation 530 when they are in the conductive or ON state. In the illustrated embodiment, the secondary ESD protection element 515 includes two steering diodes 520, 525 that are oriented opposite each other so that one of the steering diodes 525 turns on in response to a negative voltage and the other steering diode 520 turns on in response to a positive voltage that exceeds the common collector voltage (Vcc) in the circuit. The steering diodes 520, 525 may be triggered by either forward biasing or reverse breakdown.

The fourth exemplary embodiment of the optically triggered ESD protection circuit 500 differs from the first, second, and third exemplary embodiments in that the primary ESD protection element 510 includes a includes a transistor 535 that receives a signal from an optically sensitive resistor 540. Another resistor 545 may also be coupled between the optically sensitive resistor 540 and ground. Persons of ordinary skill in the art should appreciate that there may also be other differences between the first, second, and third exemplary embodiments. The resistance of the resistor 540 changes in response to the electromagnetic radiation received from the secondary ESD protection element 515. The changing resistance of the resistor 540 causes a current and/or a voltage drop across the resistor 540 to change. The base of the transistor 535 detects this change and uses it as a trigger to turn on and provide a conductive path between the bond pad 505 and ground. The transistor 535 may be any type of transistor including, but not limited to bipolar, CMOS, NMOS, PMOS, and the like. The frequency and/or wavelength of the electromagnetic radiation generated by the secondary ESD protection element 515 may be tuned to a sensitivity range of the optically sensitive resistor 540 in the optically-triggered primary ESD protection element 510.

Figure 6:
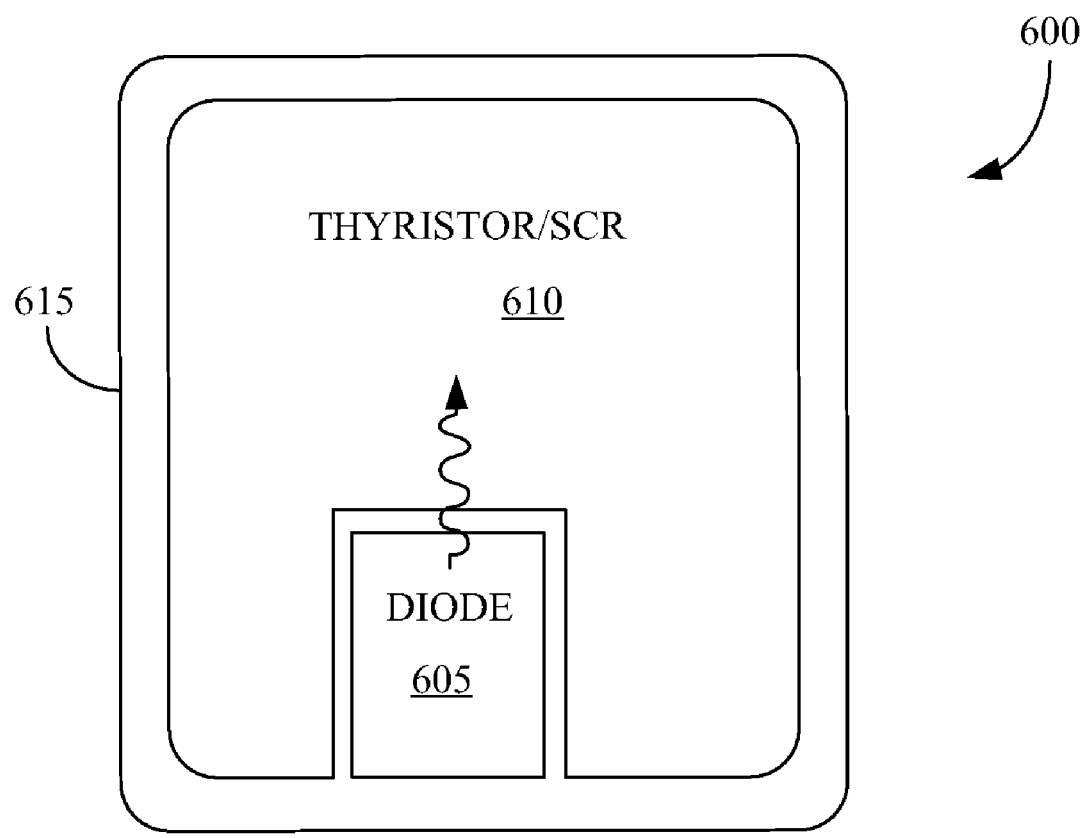
FIG. 6 conceptually illustrates a fifth exemplary embodiment of an optically triggered ESD protection circuit, in accordance with the present invention.

FIG. 6 conceptually illustrates a fifth exemplary embodiment of an optically triggered ESD protection circuit 600. In the illustrated embodiment, a top-down view of the optically triggered ESD protection circuit 600 is shown. The ESD protection circuit 600 includes a diode 605 and a thyristor or SCR 610 that are surrounded by a filled trench 615 on a silicon wafer. In various embodiments, the trench 615 may be filled with a dielectric material alone or dielectric and poly. The particular designs of the diode 605 and/or the thyristor 610 are matters of design choice. In operation, the diode 605 provides electromagnetic radiation to the thyristor 610 in response to a changing voltage such as may be produced by an electrostatic discharge. Placing the diode 605 and the thyristor 610 so that they share a portion of the same trench isolation 615 may increase the efficiency of the transmission of the electromagnetic radiation from the diode 605 to the thyristor 610, thereby improving the ESD protection provided by the ESD protection circuit. This arrangement of the diode 605 and the thyristor 610 may be used to implement some or all of the embodiments depicted in FIGS. 2-5.

Figure 7A:
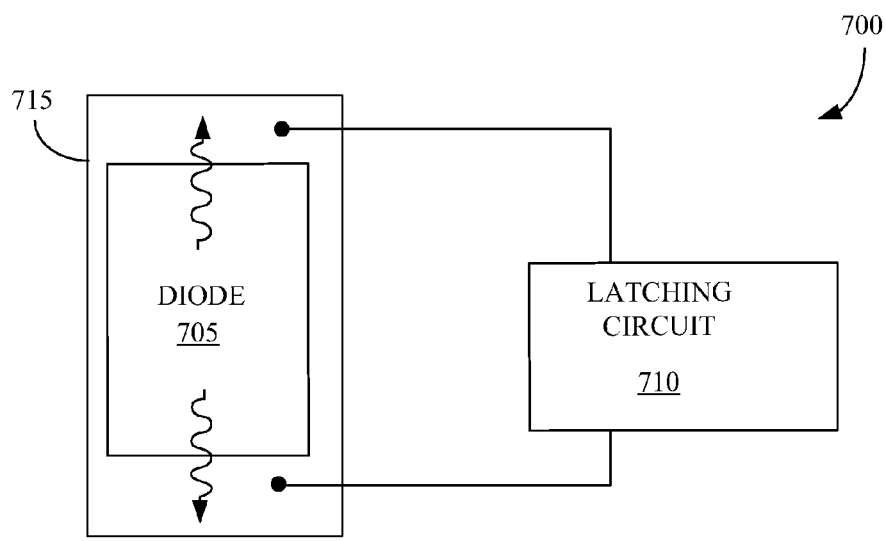
FIGS. 7A and 7B conceptually illustrate aspects of a sixth exemplary embodiment of an optically triggered ESD protection circuit, in accordance with the present invention.

FIG. 7A conceptually illustrates a sixth exemplary embodiment of an optically triggered ESD protection circuit 700. In the illustrated embodiment, a top-down view of the optically triggered ESD protection circuit 700 is shown. The ESD protection circuit 700 includes a diode 705 and a latching circuit 710. The diode 705 is surrounded by a trench 715 that electrically isolates the diode 705 from other devices. In the illustrated embodiment the latching circuit 710 is formed outside of the trench 715. However, persons of ordinary skill in the art having benefit of the present disclosure should appreciate that the diode 705 may alternatively be formed inside of the trench 715. Using the trench surrounding the diode 705 may increase the efficiency, but the trench 715 may be connected to a latching circuit 710 that is not within the immediate vicinity. The particular construction of the diode 705 and/or the latching circuit 710 is a matter of design choice. The trench 715 includes a resistive portion that can function as a photosensitive resistor, which may be coupled to the latching circuit 710 and used to trigger latching of the latching circuit 710.

Figure 7B:
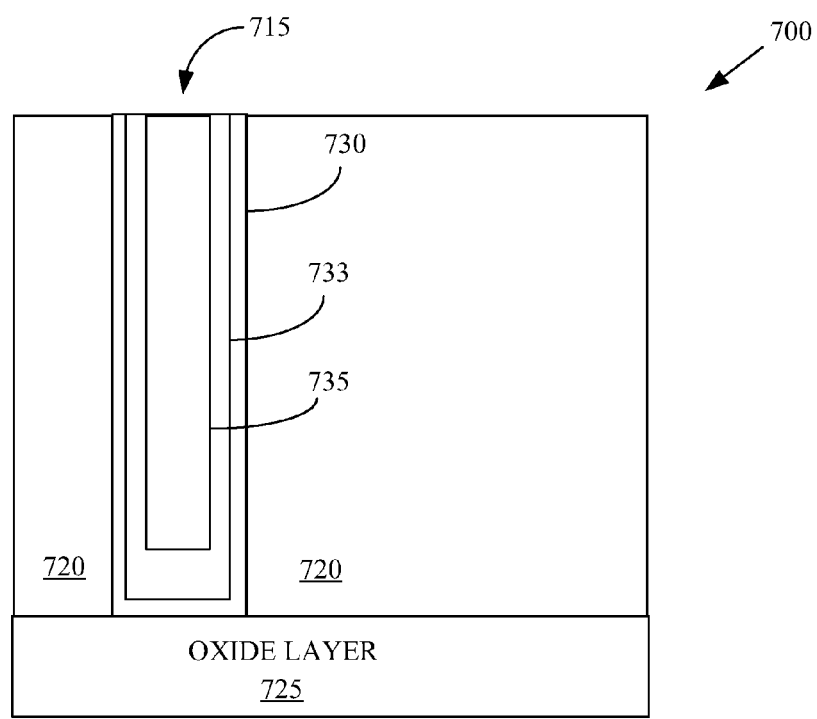

FIG. 7B conceptually illustrates a cross-sectional view of a portion of the sixth exemplary embodiment of the optically triggered ESD protection circuit 700. In the illustrated embodiment, the trench 715 is formed in a silicon layer 720 that is formed over an oxide layer 725. The trench 715 includes an oxide layer 730 and a nitride layer 733, although other layers may also be included in other embodiments. A poly fill 735 may be formed in the trench 715 and may act as the photosensitive resistor described herein. For example, the silicon layer 720 may be etched to form the trench 715 and then a dielectric (or stack of dielectrics) can be deposited on the walls of the trench 715. The poly fill 735, which may be doped or undoped, is used to fill the remaining opening in the trench 715. Persons of ordinary skill in the art having benefit of the present disclosure should appreciate that the embodiment depicted in FIG. 7B is intended to be illustrative and not to limit the present invention. In alternative embodiments, additional layers or elements may be formed using additional processing steps known to persons of ordinary skill in the art.

Referring to FIGS. 7A and 7B, in operation, the diode 705 provides electromagnetic radiation to the poly fill 735 in the trench 715 in response to a changing voltage such as may be produced by an electrostatic discharge. The resistance of the poly fill 735 changes in response to the electromagnetic radiation. The changing resistance of the poly fill 735 causes a current and/or a voltage drop across the poly fill 735 to change. The latching circuit 710 may detect this change and use it as a trigger to turn on. Forming the resistor 735 in a portion of the trench 715 may simplify design of the ESD protection circuit 700 and may reduce the area consumed by the circuit 700. This arrangement may be used to implement some or all of the embodiments depicted in FIGS. 2-5.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

What is claimed is:

1. An electro-static discharge (ESD) protection circuit for deployment between a first part and a second part of a circuit node, comprising:
   at least one optical device that generates electromagnetic radiation and couples the first part of a circuit node to ground in response to a voltage applied to the first circuit node; and
   a latch circuit that couples the first part of the circuit node to ground in response to the electromagnetic radiation generated by said at least one optical device.

2. The ESD protection circuit set forth in claim 1, wherein said at least one optical device comprises a first second steering diode configured so that the first steering diode is forward biased when the voltage applied to the first part of the circuit node exceeds a positive threshold voltage.

3. The ESD protection circuit set forth in claim 2, wherein said at least one optical device comprises a second steering diode configured so that the second steering diode is forward biased when the voltage applied to the first part of the circuit node is negative.

4. The ESD protection circuit set forth in claim 1, wherein the latch circuit comprises at least one of a silicon-controlled rectifier, a thyristor, or a transistor that turns on in response to the electromagnetic radiation generated by said at least one optical device.

5. The ESD protection circuit set forth in claim 1, comprising a photoresistor that provides a triggering signal to the latch circuit in response to the electromagnetic radiation generated by said at least one optical device.

6. The ESD protection circuit set forth in claim 5, wherein the photoresistor is formed in a portion of a trench.

7. The ESD protection circuit set forth in claim 1, comprising a photodiode that provides a triggering signal to the latched circuit in response to the electromagnetic radiation generated by said at least one optical device.

8. The ESD protection circuit set forth in claim 1, wherein said at least one optical device and the latch circuit are formed on a wafer within a tub that is encompassed by a trench.

9. The ESD protection circuit set forth in claim 1, wherein said at least one optical device and the latch circuit are formed on a wafer within different tubs that are separated by a trench.

10. An electro-static discharge (ESD) protection circuit for deployment between a first part and a second part of a circuit node, comprising:
    means for generating electromagnetic radiation and coupling the first part of circuit node to ground in response to a voltage applied to the first part of circuit node; and
    means for coupling the first part of circuit node to ground in response to the generated electromagnetic radiation.

11. A method of providing electro-static discharge (ESD) protection circuit between a first part and a second part of a circuit node, comprising:
    generating electromagnetic radiation using at least one optical device and coupling the first part of the circuit node to ground via said at least one optical device in response to a voltage applied to the first part of the circuit node; and
    coupling the first circuit node to ground via a latching circuit in response to the electromagnetic radiation generated by said at least one optical device.

12. The method of claim 11, comprising forward biasing a first steering diode in said at least one optical device when the voltage applied to the first part of the circuit node exceeds a positive threshold voltage.

13. The method of claim 12, comprising forward biasing a second steering diode in said at least one optical device when the voltage applied to the first part of the circuit node is negative.

14. The method of claim 11, wherein coupling the first part of the circuit node to ground comprises turning on at least one of a silicon-controlled rectifier, a thyristor, or a transistor in response to the generated electromagnetic radiation.

15. The method of claim 11, comprising providing a triggering signal in response to the generated electromagnetic radiation, the triggering signal being used to trigger coupling of the first part of the circuit node to ground.

16. The method of claim 15, wherein providing the triggering signal comprises providing the triggering signal using a portion of a trench.

17. The method of claim 11, comprising providing a triggering signal from a photodiode in response to the generated electromagnetic radiation, the triggering signal being used to trigger coupling of the first part of the circuit node to ground.

* * * * *